United States Patent [19]

Peterson

[11] 4,123,799
[45] Oct. 31, 1978

[54] HIGH SPEED IFGET SENSE AMPLIFIER/LATCH

[75] Inventor: Benjamin C. Peterson, Tempe, Ariz.

[73] Assignee: Motorola, Inc., Schaumburg, Ill.

[21] Appl. No.: 834,583

[22] Filed: Sep. 19, 1977

[51] Int. Cl.² .............................................. G11C 7/06
[52] U.S. Cl. .............................. 365/205; 307/DIG. 3
[58] Field of Search ............................. 365/205, 154; 307/DIG. 3

[56] References Cited

U.S. PATENT DOCUMENTS

| | | | |
|---|---|---|---|
| 3,774,176 | 11/1973 | Stein et al. | 365/205 |
| 4,053,873 | 10/1977 | Freeman et al. | 365/205 |
| 4,062,000 | 12/1977 | Donnelly | 365/205 |

*Primary Examiner*—Stuart N. Hecker
*Attorney, Agent, or Firm*—Marvin A. Glazer

[57] ABSTRACT

Disclosed is a latching type sense amplifier to be used with a static IFGET random access memory which provides an improved memory circuit. The sense amplifier employs a pair of depletion mode devices which serve both as load devices for the latch and as means for coupling a pair of bit lines to the sense amplifier. Prior to sensing, both the bit lines and the switching nodes of the latch are precharged and balanced. The selection of a memory cell induces a small differential voltage across the bit lines, causing one of the depletion mode load devices to be more conductive than the other. When the latch is enabled, regenerative amplification causes the latch to seek one of two stable states as determined by the relative conductivities of the two depletion mode load devices, thereby latching the state of the data stored in the selected memory cell.

10 Claims, 6 Drawing Figures

HIGH SPEED IFGET SENSE AMPLIFIER/LATCH

BACKGROUND OF THE INVENTION

1. Field of the Invention

This invention relates generally to semiconductor memory circuits and more particularly to an improved insulated-gate-field-effect-transistor (IGFET) sense amplifier suitable for use within a random access IGFET memory integrated circuit.

2. Description of the Prior Art

Latching type sense amplifiers have been used in the past both for static and dynamic random access IGFET memory circuits. For example, an application of a latching sense amplifier within a static IGFET RAM is shown in Schlageter et al., "Two 4K Static 5-V RAMs", *IEEE Journal of Solid-State Circuits*, Vol. SC-11, No. 5, October 1976, at page 602. An application of a latching sense amplifier within a dynamic IGFET RAM is shown in Ahlquist et al., "A 16,384-Bit Dynamic RAM", by Ahlquist et al., *IEEE Journal of Solid-State Circuits, Vol. SC-*11, No. 5, October 1976, at page 570. It has been common to connect the bit lines, leading from the memory cell to the sense amplifier, to the switching nodes of the cross-coupled circuit within the sense amplifier in order to latch the sense amplifier in the proper state. One of the disadvantages of this technique is that the capacitance associated with the switching nodes of the cross-coupled circuit tends to slow the rate at which the bit line voltage can be switched by the memory cell prior to latching the sense amplifier. In addition, the sense amplifier latch circuit can not be enabled until the voltages at the switching nodes of the cross-coupled circuit have been pulled apart from one another. The overall effect, then, is to delay the enabling of the latching sense amplifier a relatively long time beyond the selection of the memory cell.

SUMMARY OF THE INVENTION

Therefore, it is an object of this invention to provide a new and improved sense amplifier for an IGFET memory circuit which is highly sensitive to the differential voltage generated on the bit lines by a selected memory cell.

It is also an object of this invention to provide a sense amplifier for an IGFET memory circuit which does not capacitively load the bit lines used to write and sense the memory cells.

It is a further object of this invention to provide a sense amplifier for an IGFET memory circuit which can amplify and latch the binary state of a selected memory very shortly after the selection of the memory cell.

It is another object of this invention to provide a latching sense amplifier for an IGFET memory circuit which uses depletion mode IGFET devices to isolate the switching nodes of the latch from the bit lines and associated memory cells.

It is still further an object of this invention to provide an improved random access memory device to be fabricated as a monolithic integrated circuit which allows stored data to be sensed and supplied to the external world at a high rate of speed over a wide range of ambient temperature conditions.

Briefly described, the present invention relates to the use of depletion mode IGFET devices in a latching sense amplifier for functioning as both the load devices for the latching sense amplifier and as a coupling means between the sense amplifier and the bit lines. The depletion mode devices serve to isolate the switching nodes of the latching sense amplifier from the bit lines.

DESCRIPTION OF THE INVENTION

Figure 1:
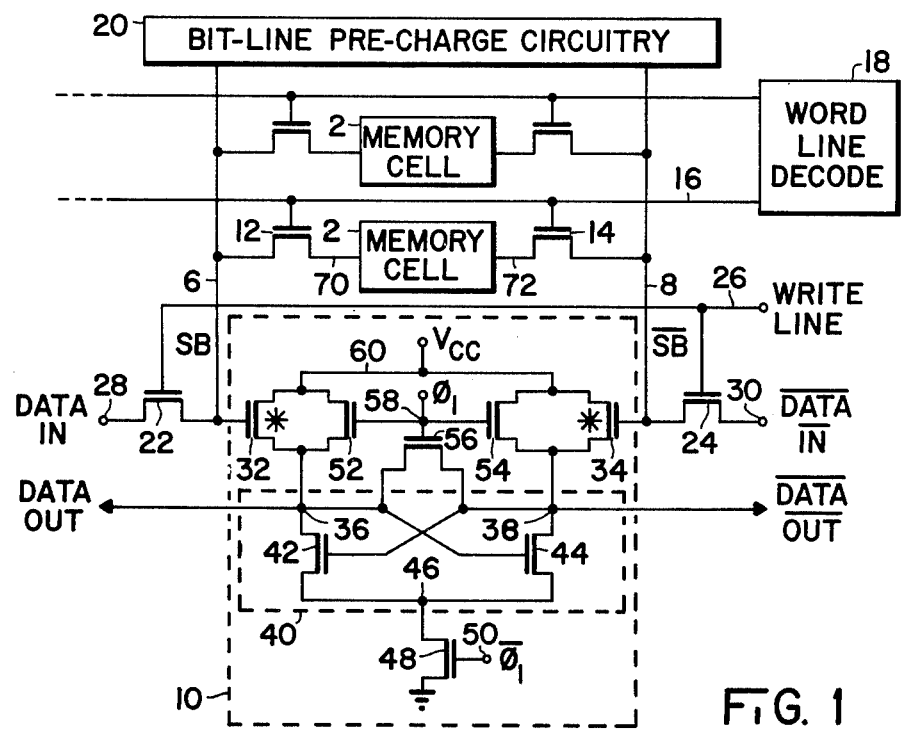
FIG. 1 is a partial schematic diagram of a memory circuit according to the invention.
Figure 2:
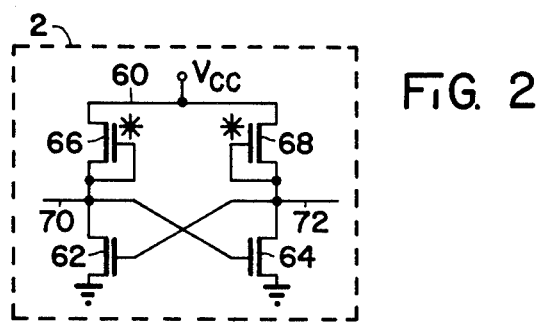
FIG. 2 is a schematic diagram of an individual memory cell.

Referring to FIG. 1, a memory circuit is shown which includes a plurality of memory cells generally shown at 2 and in greater detail in FIG. 2, a pair of bit lines as shown by conductors 6 and 8, and a sense amplifier circuit 10. Each of the memory cells 2 is coupled to the bit lines by a pair of IGFET addressing devices such as 12 and 14 for lower memory cell 2. The gate electrodes of devices 12 and 14 are coupled to a word line conductor 16; the voltage to conductor 16 is controlled by word line decode block 18. In a conventional manner, the word line decode block 18 selects a particular word line in response to addressing decoder circuitry (not shown) as is common in the art. The dashed lines on word line 16 indicate that more than one column of memory cells may be included within a memory circuit. Each column of memory cells would include a separate pair of bit lines. Further, the memory circuit may be arranged so that either each pair of bit lines is associated with a separate sense amplifier circuit, or so that the several pairs of bit lines share a common sense amplifier. In the latter case, decoder circuitry (not shown) may be used to select one of the several pairs of bit lines to be coupled to the common sense amplifier, as is known to one skilled in the art.

Figure 3:
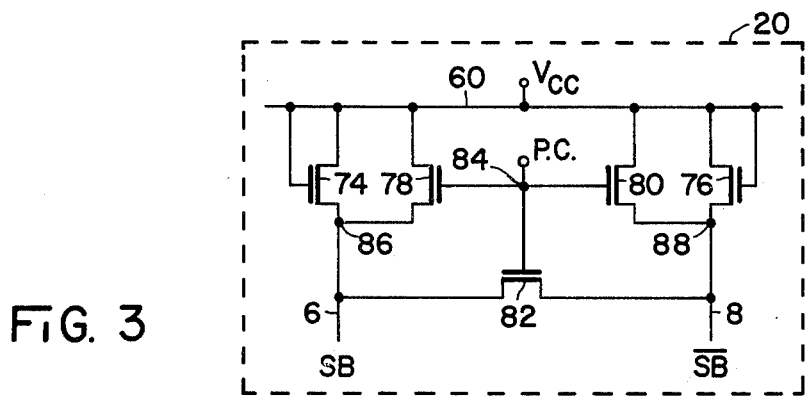
FIG. 3 is a schematic diagram showing the load and precharge circuitry for the bit lines of the memory circuit.

Bit lines 6 and 8 are coupled to bit line precharge circuitry block 20 shown in greater detail in FIG. 3. Bit line conductors 6 and 8 are also coupled to write devices 22 and 24 respectively which when enabled allow data to be written into a selected memory cell. The gate electrodes of devices 22 and 24 are connected to write line conductor 26, which, when at a high voltage level, enables write devices 22 and 24. During a write cycle the data to be written and its complement are applied to terminals 28 and 30 respectively. Bit line 6 is also coupled to the gate electrode of depletion mode IGFET device 32, and bit line 8 is connected to the gate electrode of depletion mode IGFET device 34. Depletion mode devices 32 and 34 couple bit lines 6 and 8 to switching nodes 36 and 38 of cross-coupled circuit 40. Node 36 is coupled to the drain of device 42 and also to the gate of device 44. Similarly, node 38 is coupled to the drain of device 44 and to the gate of device 42. The source of device 42 is common to the source of device 44 at node 46. Device 48, coupled between node 46 and ground, is used to enable cross-coupled circuit 40, and is controlled by clock voltage φ1 applied to terminal 50. Also coupled to nodes 36 and 38 of cross coupled circuit 40 are devices 52, 54 and 56 which comprise an equal voltage precharging circuit for sense amplifier circuit 10. The gate electrodes of devices 52, 54 and 56 are all connected to node 58, the voltage of which is controlled by clock voltage signal $\phi 1$. The drain terminals of devices 32, 34, 52 and 54 are all connected to positive supply voltage $V_{CC}$ by means of conductor 60. Nodes 36 and 38 of cross coupled circuit 40 serve as the true and complement outputs of sense amplifier circuit 10, and supply the data sensed from the memory cell to circuitry external from the memory circuit.

Referring now to FIG. 2, the memory cell 2 is shown comprising enhancement mode devices 62 and 64 and depletion mode devices 66 and 68. The drain terminals of devices 66 and 68 are coupled to positive voltage supply $V_{CC}$ via conductor 60. Gate and source terminals of device 66 are connected to conductor 70, and the gate and source terminals of device 68 are connected to conductor 72. Conductor 70 is coupled to the drain of device 62 and the gate of device 64, and conductor 72 is coupled to the drain of device 64 and the gate of device 62, forming a bistable storage element. The source terminals of devices 62 and 64 are coupled to ground. Conductors 70 and 72 are coupled to devices 12 and 14 as shown in FIG. 1.

FIG. 3 shows the bit line load and precharge circuitry 20 shown generally in FIG. 1. Devices 74 and 76 are load devices for bit lines 6 and 8 respectively. The gate and drain terminals of device 74 are connected to positive supply voltage $V_{CC}$ via conductor 60. Similarly the gate and drain terminals of device 76 are connected to positive supply voltage $V_{CC}$ via conductor 60. Also coupled to the pair of bit lines 6 and 8 are devices 78, 80 and 82 which together comprise a bit line precharge and equalization circuit. The gate electrodes of devices 78, 80 and 82 are all connected to node 84, the voltage of which is controlled by clock voltage PC. The drain terminals of precharge devices 78 and 80 are connected to positive supply voltage $V_{CC}$ via conductor 60. The source electrode of device 78 is connected to bit line 6 at node 86. The source of precharge device 80 is connected to bit line 8 at node 88. Shorting device 82 is coupled between nodes 86 and 88 and, when enabled by clock voltage PC, equalizes the voltages on bit lines 6 and 8.

Figure 4:
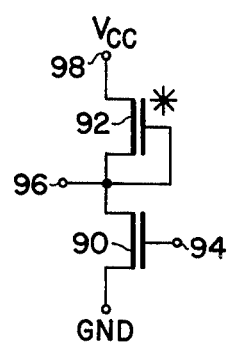
FIG. 4 is a schematic diagram of a simple inverter using a depletion mode IGFET device for a load.

Prior to describing the operation of the preferred embodiment of the invention as shown in FIG. 1, the characteristics of prior art enhancement mode and depletion mode IGFET devices will first be discussed to better understand the present invention. FIG. 4 is a schematic of a simple prior art inverter circuit and includes enhancement mode N-channel switching device 90 and depletion mode N-channel device 92 which serves as a load for the inverter circuit. The asterisk shown in FIG. 4 next to device 92 and shown in FIGS. 1 and 2 is used to denote a depletion mode device. An input voltage may be applied at terminal 94 to switch enhancement mode device 90 between a conducting and nonconducting state. When the voltage on terminal 94 is at ground potential, device 90 is nonconducting. Under this condition the voltage at output node 96 equals the positive supply voltage on terminal 98 due to the conductive channel between the source and drain terminals of depletion mode device 92. On the other hand, if the input voltage applied to terminal 94 is greater than the threshold turn on voltage of enhancement mode device 90, then device 90 will be in a conducting state and the voltage at output terminal 96 will be shorted to ground through the low impedance source to drain channel of device 94.

Figure 5:
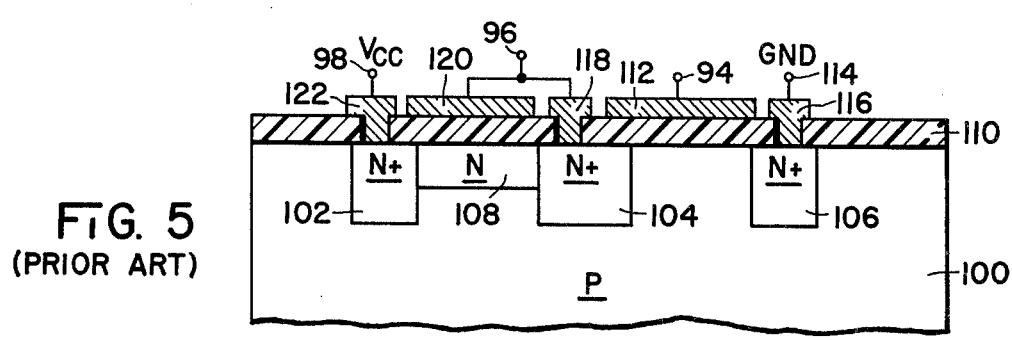
FIG. 5 is a cross section of an integrated circuit which includes the devices shown in FIG. 4.

In FIG. 5, the structural differences between prior art enhancement mode and depletion mode IGFET devices are illustrated. A region 100 is P type semiconductor substrate material. Regions 102, 104 and 106 are N type regions which have been diffused from the surface into the P type substrate. Region 108 is an N type channel formed between regions 102 and 104 by implanting negative ions from the surface of the substrate. Region 110 and the similarly shaded areas form an insulating layer on the surface of substrate region 100. Input terminal 94 is connected to a conducting region 112 which serves as the gate electrode for an enhancement mode device. With a positive voltage greater than a turn-on threshold value applied on input terminal 94 a conductive channel of N type ions is formed between regions 106 and 104 directly below insulating layer 110. Ground potential is applied to terminal 114 which is connected to conducting region 116 which in turn contacts region 106, the source of the enhancement mode device. Similarly output terminal 96 is connected to conducting region 118 which in turn contacts region 104. Region 104 serves both as the drain of the enhancement mode device and the source of the depletion mode device. Output terminal 96 also contacts a conducting region 120 which serves as a gate electrode for a depletion mode device. A positive supply voltage on terminal 98 is connected to conducting region 122 which in turn contacts region 102, the drain of the depletion mode device. It should be noted that the depletion mode device formed between regions 102 and 104 is normally conductive due to the implanted channel region 108. It will also be noted that the enhancement mode device formed between regions 104 and 106 is normally nonconducting.

In order for the enhancement mode device to be made conducting, the voltage on gate terminal 94 must be made positive with respect to the source region 106. On the other hand, a depletion mode device can be made nonconducting only when the gate electrode is at a negative voltage with respect to the source region 104. The terms source and drain, as used within this description, are used to help reference the circuit diagrams, but it should be noted that an IGFET device is a bilateral transistor and that the source and drain terminals may be interchanged without affecting the operation of the device. For a more comprehensive description of IGFET devices see INTEGRATED ELECTRONICS by Millman and Halkias, McGraw-Hill Book Company, 1972.

OPERATION

Figure 6:
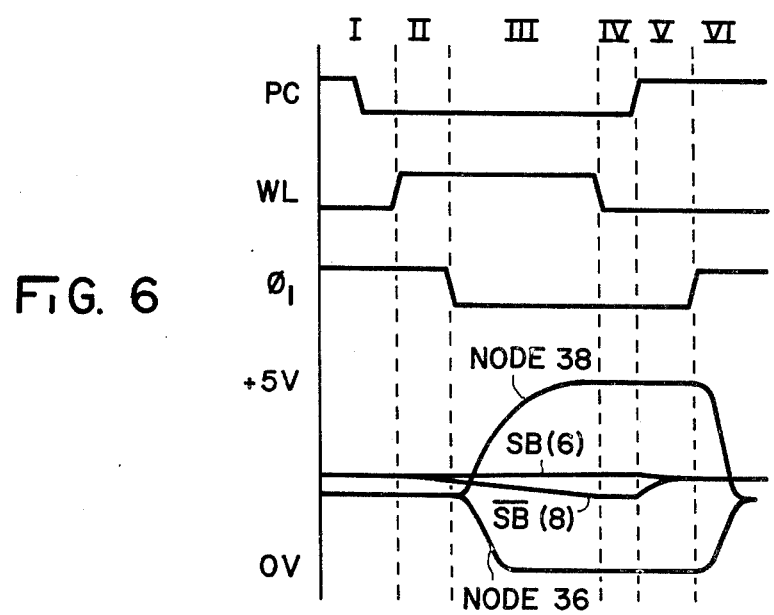
FIG. 6 is a timing diagram which demonstrates the operation of the memory circuit and the sense amplifier.

The operation of the preferred embodiment of the invention will now be described in somewhat greater detail with the aid of the timing diagram shown in FIG. 6. Prior to the selection of a memory cell for sensing, the precharge circuitry shown in FIG. 3 is activated. As can be seen in FIG. 6, the voltage PC applied to node 84 in FIG. 3 is initially at a high level, thus devices 78 and 84 in FIG. 3 are made conductive. The voltages on bit lines 6 and 8 are then charged to one threshold voltage below the clock voltage signal PC or about 2.5 volts as shown in FIG. 6. When PC is at a high level, device 82 is also made conductive and equalizes the voltages present on bit lines 6 and 8.

Referring again to FIG. 3, once the bit lines have been precharged by devices 78 and 80 and balanced by device 82, clock voltage PC is taken low. A memory cell is then selected as indicated by the positive transition of voltage WL in FIG. 6. If, for example, memory cell 2 of FIG. 1 is addressed then the voltage on conductor 16 is taken to a high level, which allows devices 12 and 14 to conduct. If memory cell 2 is represented by the circuit shown in FIG. 2, then assume the state of the memory cell is such that device 64 is conducting while device 62 is nonconductive. Since device 64 is conducting, the precharged voltage on bit line 8 will be discharged through device 14 toward ground potential. On the other hand, depletion mode load device 66 in FIG. 2 will slowly charge bit line 6 through device 12 and slightly raise the voltage on bit line 6. As indicated in FIG. 6, once the memory cell has been selected a small differential voltage is generated across bit lines SB (conductor 6) and $\overline{SB}$ (conductor 8).

Prior to enabling sense amplifier circuit 10 to sense the data signals present on the bit lines, clock voltage $\phi 1$ is at a high level while its complement $\overline{\phi 1}$ is at a low level. With clock voltage $\phi 1$ at a high level sense amplifier precharge devices 52 and 54 charge switching nodes 36 and 38 of cross coupled circuit 40 to an intermediate voltage of about +2.0 volts as shown in FIG. 6. The high level on clock voltage $\phi 1$ also makes equalizing device 56 conductive, thereby equalizing the voltages on nodes 36 and 38. The low level applied to terminal 50 by clock voltage $\overline{\phi 1}$ a makes device 48 nonconductive. Therefore, no current is supplied to the source terminals of devices 42 and 44 in cross coupled circuit 40. During the precharging and balancing of sense amplifier circuit 10, depletion mode devices 32 and 34 are conducting. However, precharge devices 52 and 54 are much larger than load devices 32 and 34. Thus, when enabled by clock voltage $\phi 1$, devices 52 and 54 dominate over devices 32 and 34 in setting the voltages on nodes 36 and 38. Immediately prior to enabling cross coupled circuit 40, the voltages at the source terminals of devices 32 and 34 are equal. However, the gate voltage of device 34 will be slightly lower than the gate voltage of device 32 because memory cell 2 has begun to discharge the voltage on bit line 8. Although devices 32 and 34 will both conduct, the drain to source channel of device 34 will be a slightly higher impedance than the drain to source channel of device 32.

As shown in FIG. 6, when a small differential voltage has been created across the bit lines, the cross coupled circuit 40 can be enabled by taking the clock voltage $\phi 1$ low. At this time precharge and balancing devices 52, 54 and 56 are all turned off while at the same time device 48 is turned on and allows current to flow through devices 42 and 44 of cross coupled circuit 40. Once enabled, devices 42 and 44 being to pull current through load devices 32 and 34. Since load device 34 has a higher impedance than load device 32, a larger voltage will be developed across the drain and source terminals of device 34 than that developed across device 32. The voltage at node 38 will then move lower than the voltage at node 36. As the voltage at node 38 moves toward ground device 42 will conduct less and less current until the regenerative action of cross coupled circuit 40 results in device 42 being made totally nonconducting while device 44 continues to conduct. The voltage on node 38 will be pulled to ground potential by the low impedance path through devices 44 and 48 while the voltage at node 36 will be pulled up to the positive supply voltage on conductor 60 by load device 32.

Further, the latching of the cross coupled circuit is demonstrated by the rising voltage of node 38 and the falling voltage of node 36 following the falling edge of clock voltage $\phi 1$. Because the logical state of the memory cell has now been latched in the sense amplifier, the word line voltage selecting the memory cell can now be removed without affecting the voltages on nodes 36 and 38. To prepare for the next sense cycle, the clock voltage PC shown in FIG. 3 is again taken to a high level in order to precharge and balance the bit lines 6 and 8. The clock voltage $\phi 1$ in FIG. 1 is again taken to a high level in order to balance and precharge the cross coupled circuit 40 while device 48 is again rendered nonconductive.

Since the gate electrodes of the depletion mode devices, which are connected to the bit lines, have a very high input impedance and very little capacitance, the sense amplifier has virtually no capacitive loading effect on the bit lines. Thus, when selected, a memory cell can cause a differential voltage to be created across the bit lines more quickly. Once the differential voltage has been established across the bit lines, the sense amplifier can be latched very quickly because the depletion mode load devices are already biased to be conductive; the differential voltage on the bit lines simply causes one of the load devices to be more conductive than the other. Thus, the cross-coupled circuit within the latch can be enabled to perform the sensing function even though the switching nodes of the crosscoupled circuit are initially at the same voltage. Also, the output of the sense amplifier provides improved drive capability to external circuitry because the depletion mode load devices allow the output-high voltage to be pulled up to the positive voltage supply, thereby generating a larger output voltage swing. Enhancement mode load devices, used in prior art sense amplifier latches, reduce the output high voltage by the amount of the gate to source threshold turnon voltage. Finally, the differential mode of operation is beneficial in cancelling the effects of temperature and device parameter variation on the performance of the sense amplifier.

In order to write data into memory cell 2, word line conductor 16 is again taken to a high level which enables devices 12 and 14 coupling conductors 70 and 72 of the memory cell to the bit lines. Write line conductor 26 is also taken to a high level which enables write devices 22 and 24. If it is desired to write a logical "1" into memory cell 2, then a high level voltage would be applied to terminal 28 while a low level would be applied to terminal 30. Device 22 will couple the high voltage onto bit line conductor 6 and device 24 will couple a low voltage onto bit line conductor 8. Device 12 will couple the high level voltage to conductor 70 of memory cell 2 while device 14 will couple the low voltage to conductor 72.

As best illustrated in FIG. 2, the high level present on conductor 70 will cause device 64 of memory cell 2 to conduct while the low voltage on conductor 72 will render device 62 nonconducting. Having been set to the desired stable state, the voltage on write line conductor 26 can now be taken low once again to disable devices 22 and 24. Word line conductor 16 may now be taken low to prepare for the next memory cycle.

Thus the present invention provides an improved memory circuit and sense amplifier which allows data to be written into a plurality of memory cells, and allows the data stored in the cells to be quickly sensed and output to the circuitry external to the memory circuit.

The reduction of loading capacitance on the bit lines together with the high sensitivity and improved output drive capability of the sense amplifier result in a memory circuit which operates within a desired speed range over a wide extreme of ambient temperatures.

What is claimed is:

1. A sense amplifier for differentially receiving voltage data signals from an IGFET device memory circuit comprising:
    (a) a cross-coupled circuit, and
    (b) first and second depletion mode IGFET devices coupled to the cross-coupled circuit for coupling the data signals to said cross-coupled circuit, and for providing a selective differential load impedance for latching said cross-coupled circuit to one of two states.

2. A sense amplifier as recited in claim 1 wherein said first and second depletion mode IGFET devices each include gate, source, and drain terminals, each of the gate terminals being electrically isolated from each of the respective source terminals, and each of the gate terminals being electrically isolated from each of the respective drain terminals.

3. A sense amplifier as recited in claim 2 wherein:
    (a) said first depletion mode IGFET device is coupled between a power source and a first switching node of said cross-coupled circuit, and
    (b) said second depletion mode IGFET device is coupled between the power source and a second switching node of said cross-coupled circuit, wherein said first and second depletion mode devices constitute a first and second load impedance for the first and second switching nodes, respectively, of said cross-coupled circuit, and wherein the voltage difference between said data signals produces a corresponding impedance difference between said first and second load impedances.

4. A sense amplifier as recited in claim 3 further comprising:
    (a) an enhancement mode IGFET device coupled between the cross-coupled circuit and the power source and responsive to a clock voltage whereby current is enabled to said cross-coupled circuit for latching said cross-coupled circuit to one of said two states.

5. A sense amplifier as recited in claim 3 further comprising:
    (a) means coupled to the cross-coupled circuit for establishing a substantially equal voltage at each of said switching nodes of the cross-coupled circuit prior to latching said cross-coupled circuit to one of said two states, said equal voltage being a voltage substantially intermediate to the voltages established at said first and second switching nodes of said cross-coupled circuit after latching said cross-coupled circuit to one of said two states.

6. A sense amplifier as recited in claim 5, wherein said equal voltage means comprises:
    (a) first and second enhancement mode IGFET devices, the first enhancement mode IGFET device being coupled between the power source and said first switching node of said cross-coupled circuit, the second enhancement mode IGFET device being coupled between the power source and said second switching node of said cross-coupled circuit, said first and second enhancement mode devices being responsive to a clock voltage for charging said first and second switching nodes of said cross-coupled circuit to said intermediate voltage prior to latching the cross-coupled circuit to one of said two states.

7. A sense amplifier as recited in claim 6 further comprising:
    (a) a third enhancement mode IGFET device coupled between said first and second switching nodes of said cross-coupled circuit and responsive to the clock voltage for establishing said substantially equal voltage at said two switching nodes.

8. An IGFET memory for an integrated circuit comprising:
    (a) a plurality of memory cells for storing binary data,
    (b) bit lines coupled to the memory cell for writing binary data into the memory cells and for sensing the binary data stored in the memory cells,
    (c) word-line addressing means coupled to the memory cells for selecting a particular memory cell whereby said word line addressing means couples a particular memory cell to said bit lines,
    (d) sensing means coupled to said bit lines for sensing the binary data stored in the particular memory cell selected by the word-line addressing means,
    (e) said sensing means including a cross-coupled circuit, and a pair of depletion mode IGFET devices for coupling the bit lines to the cross-coupled circuit, the bit lines being electrically isolated from the cross-coupled circuit.

9. An IGFET memory as recited in claim 8 wherein:
    (a) each of said memory cells comprises a bistable circuit.

10. An IGFET memory as recited in claim 8 wherein:
    (a) said pair of depletion mode IGFET devices is responsive to the binary data present on said bit lines for providing a selective differential load impedance for latching said cross-coupled circuit to one of two states.

* * * * *